United States Patent [19]
Adler et al.

[11] Patent Number: 5,757,050
[45] Date of Patent: *May 26, 1998

[54] FIELD EFFECT TRANSISTOR HAVING CONTACT LAYER OF TRANSISTOR GATE ELECTRODE MATERIAL

[75] Inventors: Eric Adler, Jericho, Vt.; Subhash Balakrishna Kulkarni, Peekskill, N.Y.; Randy William Mann, Jericho, Vt.; Werner Alois Rausch, Stormville, N.Y.; Luigi Ternullo, Jr., Colchester, Vt.

[73] Assignee: International Business Machines Corporation, Armonk, N.Y.

[*] Notice: The term of this patent shall not extend beyond the expiration date of Pat. No. 5,670,812.

[21] Appl. No.: 823,360

[22] Filed: Mar. 24, 1997

Related U.S. Application Data

[63] Continuation of Ser. No. 536,725, Sep. 29, 1995, Pat. No. 5,670,812.

[51] Int. Cl.[6] ................................................. H01L 27/01
[52] U.S. Cl. .................. 257/347; 257/350; 257/377; 257/382; 257/903
[58] Field of Search ................................ 257/347, 350, 257/377, 382, 383, 903

[56] References Cited

U.S. PATENT DOCUMENTS

| | | | |
|---|---|---|---|
| 5,156,987 | 10/1992 | Sandhu et al. | 438/153 |
| 5,670,812 | 9/1997 | Adler et al. | 257/347 |

*Primary Examiner*—Minh-Loan Tran
*Attorney, Agent, or Firm*—Heslin & Rothenberg, P.C.

[57] ABSTRACT

Improved field effect transistor (FET) structures are described. They include a thin film transistor (TFT), wherein a contact layer directly connects a diffusion region of the TFT to an active site of another device, e.g., another transistor. This invention is especially suitable for TFT's which are built on one or more conductive studs. Static random access memory (SRAM) cells incorporating one or more of the TFT's are also described. Moreover, this invention is directed to methods for preventing or alleviating the problems associated with gouging during formation of contact layers.

6 Claims, 2 Drawing Sheets

FIELD EFFECT TRANSISTOR HAVING CONTACT LAYER OF TRANSISTOR GATE ELECTRODE MATERIAL

This application is a continuation of application Ser. No. 08/536,725 filed Sep. 29, 1995 which application is now U.S. Pat. No. 5,670,812.

TECHNICAL FIELD

The present invention relates generally to semiconductor devices, and more particularly, to novel field effect transistor structures which include thin film transistors, such as static random access memory cells.

BACKGROUND ART

Thin film transistors (TFT's) are becoming popular in the effort to reduce the cell size of various semiconductor devices, thereby conserving valuable space on the semiconductor chip surface. The use of TFT's is generally described, for example, in U.S. Pat. No. 5,156,987 of Sandhu et al., and U.S. Pat. No. 5,278,459 of Matsui et al. New uses for TFT's are also described in pending U.S. patent application Ser. No. 08/537,219 now U.S. Pat. No. 5,675,185 assigned to the assignee of the present invention, and filed on the same date.

As one example, TFT's are finding use as elements of static random access memory cells (SRAM's), which are very common and important devices in microelectronic structures. Because of the ever-increasing number of features intended for the dimension of a typical silicon chip surface, SRAM's are being utilized in arrays of steadily-increasing density. The miniaturization of these features eventually reaches the boundaries of lithographic capabilities.

It's known that potential problems can arise when trying to incorporate TFT's into existing chip fabrication technology, e.g., interference with existing front-end-of-the-line (FEOL) and back-end-of-the-line (BEOL) processes for preparing circuit structures. Some of those problems were successfully addressed by the invention of the above-referenced copending patent application Ser. No. 08/537,219. That application describes the vertical stacking of TFT's to conserve critical space at the base level of an FET structure. The stacking is accomplished in part by using conductive studs which connect various levels of the structure. The copending application also includes other novel aspects related to FET's, e.g., the use of an undoped cap oxide layer over a planarized insulator layer; the use of a protective interfacial layer of doped polysilicon to cover stud surfaces; and the placement of the source/drain area of a TFT directly over a stud contact. All of these inventive features can increase the value and popularity of FET's in a variety of applications, as described below.

As mentioned previously, the disclosure of patent application Ser. No. 08/537,219 is directed in part to the use of conductive studs which can be positioned both above and below an active device like a TFT. While the use of the studs can result in a denser, more integrated circuit on a given level, there are also some disadvantages associated with them. For example, the necessary connection between a stud on a lower level with a TFT directly above is usually made through the source/drain (i.e., the "body polysilicon") region of the TFT. In an SRAM cell, various pairs of TFT's and other transistors have to be coupled, with source/drain regions of certain transistors being connected to the gates of other transistors. These cross-connections require studs and/or a substantial amount of wiring, in addition to the wiring needed inside a given TFT. The space needed for the wiring and connections can quickly increase the size of the memory cell to an unacceptable level, given the continuing trend toward miniaturization in these types of devices.

It's thus apparent that a need exists for further increasing the density of features within TFT-containing structures, without adversely affecting the performance of the device in which these structures are functioning, e.g., an SRAM.

One inventive method for satisfying this need is set forth in detail below, and includes the use of a contact layer of transistor gate electrode material, which can form a direct connection between the source/drain region of a TFT to the gate of another TFT.

The use of the contact layer is very effective for reducing the size of TFT's and structures based thereon—especially those utilizing stud connections. Conventional patterning and etching procedures can be carried out to form the contact layer within a via etched in the gate dielectric layer which normally covers the diffusion regions of the transistor. Studs connected directly or indirectly to the diffusion region of interest are also formed by conventional etching processes.

A combination of directional and non-directional etching is often necessary to shape a contact layer of appropriate dimensions within the via of a gate dielectric layer in an FET. Over-etching may be required, since several variables have to be considered, such as material thickness, sidewall characteristics, and etch rates. However, these etching processes can lead to other problems. For example, over-etching may cause grooves or gouges in the upper surface of the diffusion layer. The gouges can result in a high resistance path for current flowing from a power source or from other active devices. Higher resistance can in turn hurt the performance of any attached device.

If the gouges are deep enough, they can bisect (or nearly bisect) the source/drain layer, thereby weakening or severing electrical connection between the contact layer and the diffusion region of the TFT. If the TFT is part of an SRAM cell, the TFT could in turn become disconnected from the other TFT's and transistors in the cell, leading to its failure as a memory device.

Thus, techniques for solving the problems caused by imprecise patterning and etching steps in the fabrication of certain types of TFT's would be welcome in the field of semiconductor construction. These techniques should have minimal effect on semiconductor performance, and should not significantly add to the complexity and cost of manufacture.

DISCLOSURE OF THE INVENTION

The needs described herein have been satisfied by the discovery of an improved FET structure, partially described above. The structure comprises:

a) a thin film transistor which itself comprises a doped diffusion region and a channel; a gate dielectric layer disposed over the channel and diffusion region; and a transistor gate electrode disposed over a portion of the gate dielectric layer, and substantially self-aligned with the channel;

b) at least one stud underlying the thin film transistor, and connected to a portion of the diffusion region; and c) a contact layer of transistor gate electrode-material applied over at least a portion of the diffusion region; wherein the contact layer is formed simultaneously with the transistor gate electrode.

The contact layer provides a direct connection between the thin film transistor and a gate or other active element of another transistor. The direct connection eliminates the need for some of the wiring and wiring connection sites necessary in the past, thereby helping on space requirements, and increasing the density of the FET structure.

An FET structure as described above is a very useful component in an SRAM cell.

Another aspect of the present invention is directed to a technique for avoiding problems which occasionally may occur during formation of the contact layer described above. Problems caused by the inadvertent gouging of the diffusion region of the thin film transistor can be alleviated or eliminated by expansion of the width of the stud which underlies the diffusion region, so that at least a portion of the stud is disposed under a portion of the gate dielectric layer which contacts the gate electrode. Expansion of the stud preserves the desired current path through the transistor, thereby maintaining its performance capabilities.

Moreover, optional embodiments of this invention include reducing the width of the contact via in which the contact layer is formed. The contact layer then usually overlaps adjacent portions of the gate dielectric layer, thereby eliminating the gouging which would otherwise lead to problems with the performance of the transistor.

Methods for preparing certain thin film transistors and structures which incorporate them also form part of the present invention. The following description provides specific details.

DETAILED DESCRIPTION OF THE INVENTION

Figure 1:
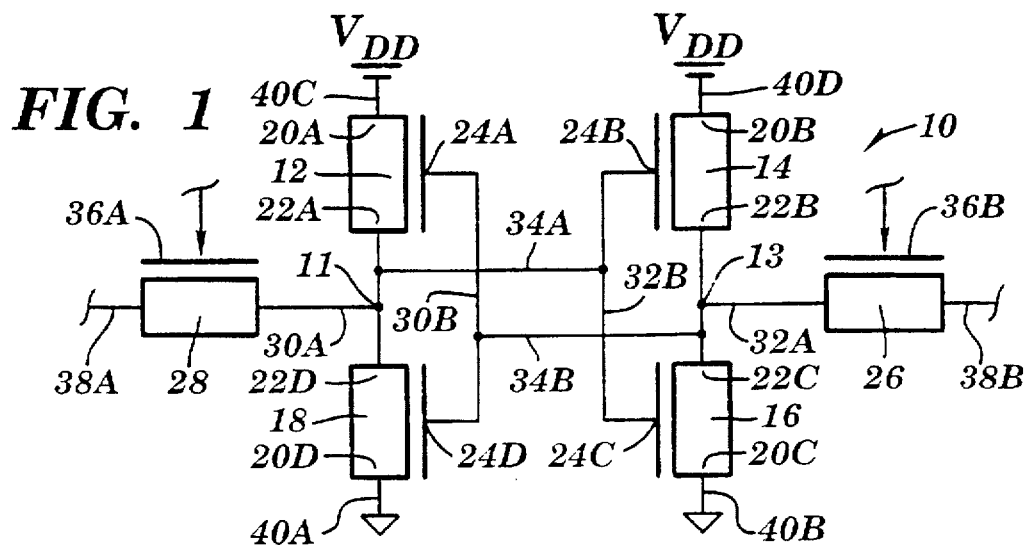
FIG. 1 depicts an exemplary SRAM cell which is the subject of some embodiments of the present invention.

FIG. 1 depicts a typical SRAM cell which provides an appropriate context for the various embodiments of the present invention. SRAM cells are well-known in the art and described, for example, in *VLSI Technology* S. M. Sze (Ed.), McGraw-Hill, Second Edition, 1988, the contents of which are incorporated herein by reference. In an SRAM, the bit state information is usually stored in a pair of cross-coupled inverters. The inverter pair forms a "flip-flop", which forces one inverter to be at a high potential while the other is low, and vice versa. The memory logic state is determined by which of the two inverters is high.

Specific reference to FIG. 1 is now made, in which element 10 is a typical SRAM cell. Transistors 12 and 14 (usually p-FET's) and 16 and 18 (usually n-FET's) include source regions 20A, 20B, 20C and 20D, respectively; as well as drain regions 22A, 22B, 22C and 22D, respectively. Source regions 20A and 20B usually connect to the "high" side of the power supply. Conventional transistors like these also include gates 24A, 24B, 24C and 24D, respectively.

One or more of the transistors can actually be thin film transistors (TFT's), e.g., transistors 12 and 14. As can be seen from FIG. 1, two additional transistors (usually n-FET's) are used in this type of SRAM, i.e., first access transistor 26 and second access transistor 28. All of the transistors and TFT's are coupled in conventional fashion by the use of interconnection lines 30A and 30B; 32A and 32B; and 34A and 34B. The first and second nodes for the cross-coupled inverters are designated as elements 11 and 13, respectively. Word line and bit line elements 36A, 36B and 38A, 38B, respectively, can be connected to the access transistors as described. The ground contacts are designated as elements 40A and 40B. Elements 40C and 40D represent connections to a power supply.

Those of skill in the art understand that there are variations on the SRAM concept, in terms of its structure and function, although it always has the same general utility, e.g., serving as a memory device. Those alternative structures fall within the scope of the present invention.

Figure 2:
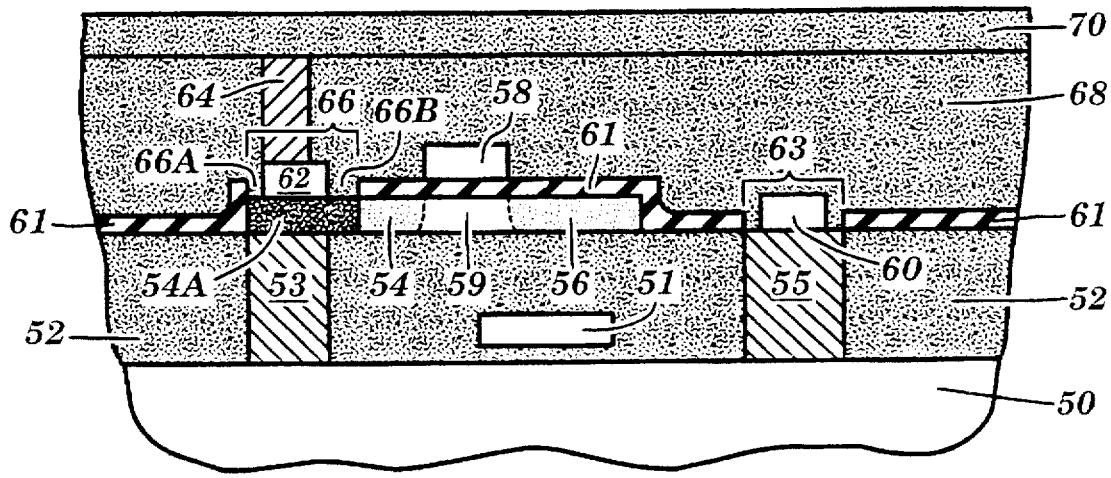
FIG. 2 represents one primary embodiment of this invention, and is a cross-section of an exemplary FET structure which contains contact layers according to the present invention.

As described above, reduction in the size of devices like the SRAM cell can be accomplished by reducing the size of components therein, e.g., the various transistor structures. An example of an FET structure based on the present invention is depicted in FIG. 2. Many of the features in this figure are well-known in the art. The TFT is usually formed on or within an insulator layer 52 which has been deposited on a single crystal silicon substrate 50. As known in the art, the transistor includes source and drain regions 54 and 56 (which are interchangeable in terms of position within the transistor). For the sake of simplicity, the source/drain regions will sometimes be referred to herein as the "diffusion region" or "diffusion layer". (The source or drain will sometimes be referred to individually if necessary for understanding a particular section of this disclosure.) The TFT also includes gate 58 and channel 59, the latter element separating the source and drain which constitute the diffusion region. Furthermore, the gate dielectric layer 61 covers the diffusion region 54/56, separating gate 58 from channel 59 in conventional fashion.

Circuit element 51 represents any active electrical element formed in the "bulk" (i.e., wafer) region of a microelectronic device, or in a layer contacting the bulk region. The element could, for example, be a resistor, capacitor, or diode. All of these elements can be connected to the surrounding FET structure depicted in the figure by conventional techniques which need not be shown here. Element 51 could alternatively be connected to an active site on a circuit element which is not depicted in the present invention, e.g., an element from a separate device, such as another portion of the SRAM depicted in FIG. 1, or to the gate of any metal oxide semiconductor FET (MOSFET). Thus, it should be apparent that element 51 is not a critical component of the present invention.

The specific formation of a TFT as depicted in FIG. 2 need not be dealt with exhaustively here, since the techniques involved are known in the art. In brief, the various insulator (dielectric) layers may be prepared of standard materials like oxides, nitrides, or glass, e.g., phosphosilicate glass (PSG) or spun-on-glass (SOG). The insulator material can be deposited by conventional techniques, such as chemical vapor deposition (CVD). Plasma-enhanced chemical vapor deposition (PECVD) is most often employed, and is usually carried out at a temperature in the range of about 400° C. to about 500° C. Planarization techniques for the insulator layers, such as chemical-mechanical polishing (CMP), are also known in the art.

Studs 53 and 55 of FIG. 2 are conductive materials, and are usually formed of a refractory metal like tungsten or molybdenum. Refractory metal alloys are also possible. The studs can be put into place by techniques known in the art, e.g., deposition of a blanket layer of the stud material, followed by patterning with a resist and then appropriately imaging and etching. Standard CVD techniques can be used. The lower terminus' of studs 53 and 55 could individually be connected to another circuit element in the bulk wafer, or they could instead simply be embedded in any portion of substrate 50. (As mentioned further on, only one of studs 53 and 55 need be present at this level of the FET structure.)

It is sometimes desirable to apply a protective, interfacial layer of polysilicon over the top of stud 55, prior to the deposition of contact layer 60. The use of the protective layer can prevent metallic contamination of contact layer 60 from the stud. Such a layer is described in the above-referenced copending application, Ser. No. 08/537,219. While the layer is not specifically depicted in FIG. 2, its optional presence is within the scope of this invention.

The diffusion region 54/56 can be formed, for example, by first depositing a layer of amorphous silicon, sometimes referred to as the "body polysilicon". This layer is usually deposited by CVD, low pressure CVD, or PECVD, and is then patterned to form source and drain regions, which can be implanted with dopant atoms to impart the appropriate polarity and conductivity. The amorphous layer is often annealed to crystallize the silicon (i.e., becoming polysilicon), and increase its grain size. It may also sometimes be subjected to a threshold voltage ($V_t$) implant, depending on the desired electrical characteristics. The gate dielectric layer 61 is formed over layer 56 by conventional techniques, e.g., CVD. It usually comprises an oxide material.

Secondary level stud 64 is also an optional feature of this invention. It can be used as another connector for the TFT of FIG. 2, or for transistors connected thereto. It can be formed in the same manner as the other studs. The same is true of studs 94, 124, and 164 in FIGS. 3, 4, 5, respectively. In each instance, the secondary level stud need not be in contact with the contact layer, but could instead be attached to some other portion of the TFT.

Various conventional features have been omitted from these figures for the purpose of clarity, e.g., spacers on each side of the gate conductive regions; silicide regions in portions of the diffusion regions, or on top of gate 58; stud liner materials; and the like. Again, those of ordinary skill in the art understand that these features are typical in transistor construction, and do not have special significance in the description of the present invention. Other details regarding the manufacture of FET structures are known in the art and available from various other sources. Moreover, the above-referenced copending application, Ser. No. 08/537,219, incorporated herein by reference, is instructive in this respect.

As shown in FIG. 2, gate dielectric layer 61 has been opened up by standard etching techniques to allow formation of contact layer 62, within contact via 66. (The optional additional opening in gate dielectric layer 61 for optional contact layer 60 will be discussed below.) Prior to formation of contact layer 62 and gate 58, an implant is made within via 66 for the formation of a "buried contact", i.e., a direct contact between a gate electrode and a diffusion region, usually through a via opened up in an oxide layer. The buried contact is usually then covered with another insulator layer. The concept of a buried contact is known in the art and described for example, in U.S. Pat. Nos. 5,410,174; 5,319,240; and 5,272,099, the contents of each being incorporated herein by reference. The Sze text mentioned above also describes buried contacts. The choice of a dopant will depend on the particular FET device being manufactured. Boron is usually the implanted ion for a p-FET device, while arsenic or phosphorous is usually the implanted ion for an n-FET device. The dopant impurity level for the buried contact implant is usually in the range of about $10^{18}$ atoms per cc to about $10^{21}$ atoms per cc. Techniques for implanting the dopant are well-known in the art and described, for example, in the Sze text mentioned above. The region of layer 54 which has received the buried contact implant is indicated as 54A.

As mentioned above, the general area of dielectric layer 61 which is disposed over stud 55 can optionally be opened up to form via 63, if a contact layer 60 is desired, i.e., a contact layer directly connected to the upper terminus of the stud. Layer 60 would be simultaneously formed with layers 62 and 58. The desirability of this optional contact layer will of course depend on the electrical configuration for devices incorporating the FET structure. For the sake of clarity, the process described below will assume that contact layer 60 is present, with the understanding that it is in fact part of an optional embodiment.

Contact layers 62, 58, and 60 can be prepared by first depositing a suitable material like polysilicon over the entire surface of the structure being formed. The usual techniques may be employed for deposition, e.g., CVD or low pressure CVD. Deposition temperatures usually range from about 600° C. to about 650° C. As deposited, layers 62, 58, and 60 usually have a thickness in the range of about 1000 Angstroms to about 2000 Angstroms, based on the types of FET structures currently being produced, e.g., those used in SRAM cells of 1 to 16 megabits. (This thickness is exemplary in view of current technologies, since it is understood that higher density semiconductor devices developed in the future may call for less thickness in a layer of this type.)

The blanket layer of polysilicon-type material is then imaged and etched by conventional processes to form contact layer 62, gate 58, and contact layer 60. A combination of known directional and non-directional etching techniques are usually employed to provide the proper dimensions for each of these layers. Reactive ion etching (RIE) is an example of a directional technique, while wet-etching with solvents is illustrative of a non-directional or "isotropic" technique. The operation of gate 58 in a typical FET, e.g., a MOSFET device, is well-known and described, for example, in *Microelectronics*, by J. Millman, McGraw-Hill, 1979. The gate serves as a mask for implanting the diffusion region 54/56.

Sometimes, a protective dielectric layer (not shown) is applied over the exposed surface of the TFT at this stage, covering layer 62, gate 58, and contact layer 60. It can be used, for example, to prevent the flow of contaminants into the TFT.

Contact layer 62 provides a direct connection between the diffusion region of the featured TFT with the active site of another transistor, e.g., the gate of another transistor in the SRAM cell of FIG. 1. For example, the TFT depicted in FIG. 2 could be used as transistor 12 of FIG. 1. Thus, the diffusion region, encompassing layers 54 and 54A would be directly connected to the gate of transistor 14, via interconnections 30A, 34A, and 32B. This direct type of connection is an improvement over connections of the prior art, which usually involved connection through a wire attached to stud 64, and then through another stud which would have to be attached to the other end of the wire. Connection in the manner described herein frees up critical space overhead which can be used for other wiring connections for the entire device. Furthermore, there is a distinct processing advantage in forming contact layer 62 and gate 58 in one deposition. Although an extra mask is needed for the deposition of both layers, the process is considerably streamlined when compared to one which may require at least two additional layers of metallization for the wire-type connection mentioned above.

In the embodiment of FIG. 2, stud 53 is positioned under and connected to the portion of the diffusion region (54A) upon which contact layer 62 is formed. However, it should be understood that some embodiments of this invention do not require the presence of stud 53 under layer 54A. In other words, such a stud, if present, could be attached to some other portion of the TFT. A stud like element 53 is present in the embodiments which are directed to the gouging problem, discussed below.

As mentioned previously, optional embodiments of this invention include the formation of an additional contact layer 60 during the formation of contact layer 62 and gate 58. As shown in FIG. 2, a contact via 63 would first be formed in layer 61, exposing at least a portion of the upper terminus of stud 55. The presence of contact layer 60 provides an additional connection site between another transistor (as shown in FIG. 1) with conductive stud 55. This arrangement can enhance cross-coupling capability for an SRAM cell, without the use of additional metallization layers, e.g., for wire connections.

Figure 3:
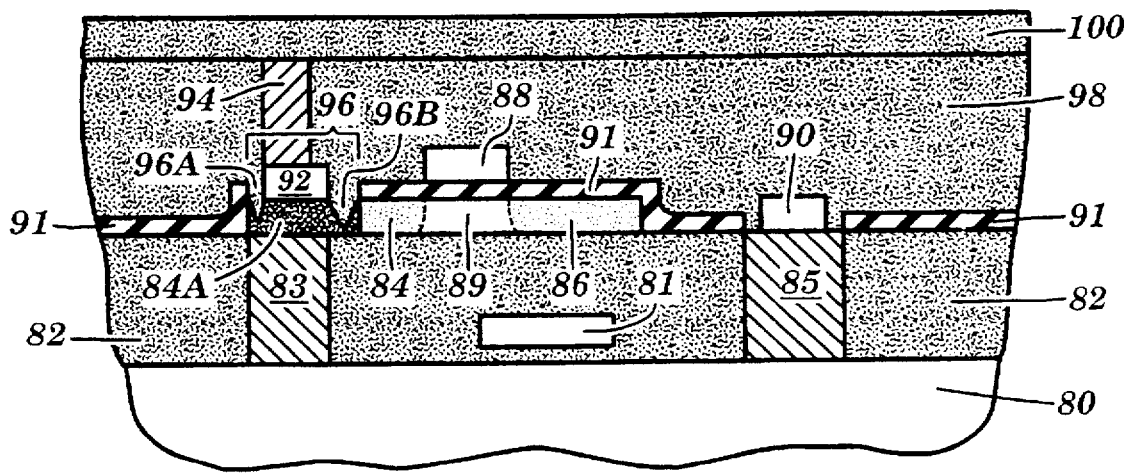
FIG. 3 is a cross-section of an FET structure outside the scope of this invention.
Figure 4:
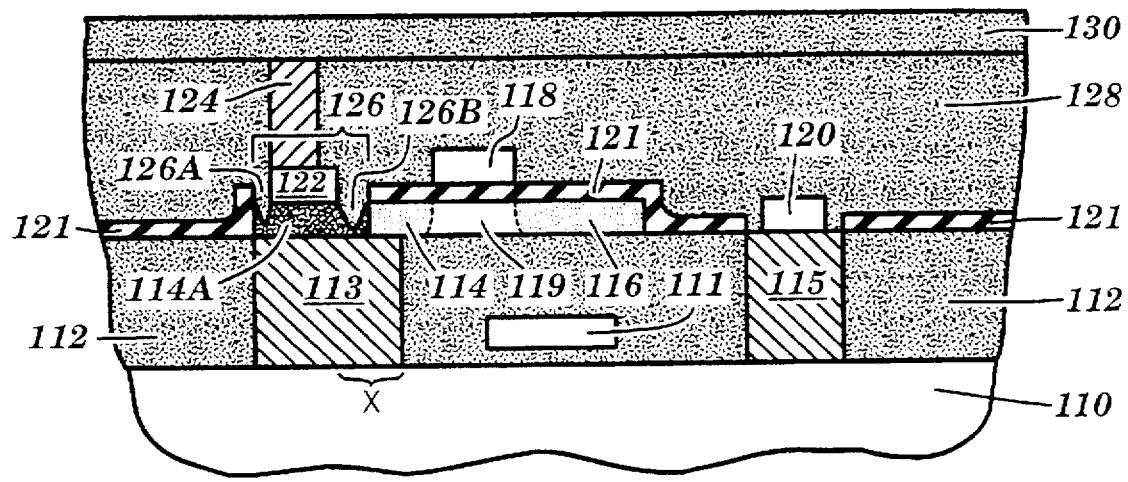
FIG. 4 represents a cross-section of another exemplary FET structure according to this invention, in which some of the problems associated with the structure of FIG. 3 are alleviated.

As described above, a combination of directional and non-directional etching is usually necessary to shape contact layer 62, shown in FIG. 2. Etching has to be carried out sufficiently to remove any extraneous material from the sidewalls of the layer and the sidewalls of contact via 66. Over-etching is often required, and this can sometimes cause grooves or gouges in the exposed upper surface of 54A. FIG. 3 is modeled after FIG. 2, and has features substantially identical thereto. The gouges are depicted as 96A and 96B, occurring within layer 84A, which has the buried contact implant. Since normal transistor activity involves the flow of current from contact layer 92 to layer 84, it should be apparent that these gouges could represent a serious problem. For example, they can result in a high resistance path for current flowing into or through the transistor. The higher resistance can in turn hurt the performance of the device. Moreover, if the gouges are deep enough, they can effectively bisect layer 84A, thereby severing electrical connection between the contact layer and the rest of the TFT, leading to failure of any attached device.

Thus, another embodiment of the present invention is based on a solution to the gouging problem which can sometimes occur during formation of the contact layer described above. One aspect of this embodiment is depicted in FIG. 4, which again includes features which are analogous to those of FIGS. 2 and 3. In this figure, stud 113 has been expanded in width, so that at least a portion of the stud is disposed under (aligned under) a portion of gate dielectric layer 121. The expanded portion of the stud is indicated by the dimension "X". The expanded stud more readily allows current to flow through contact layer 122, layer 114A (the buried contact region), stud 113, and then up to diffusion layer 114, which is part of the featured TFT. Resistance is relatively low, despite the presence of gouge 126B.

The amount of desirable expansion of the stud depends on several variables, including the amount of resistance caused by the gouging, as well as electrical flow requirements for the TFT. In general, for a TFT which is part of an SRAM of current dimensions (1 to 16 megabits), the overlap width of the expanded stud area X aligned under dielectric layer 121 and diffusion layer 114 is usually at least about 0.1 micron.

Those of ordinary skill in the art understand that the expanded width of stud 113 is designed in anticipation of the potential gouging problem, during formation of the stud. Thus, the masking and etching steps during stud formation would be adjusted accordingly, prior to formation of all layers above the stud.

Figure 5:
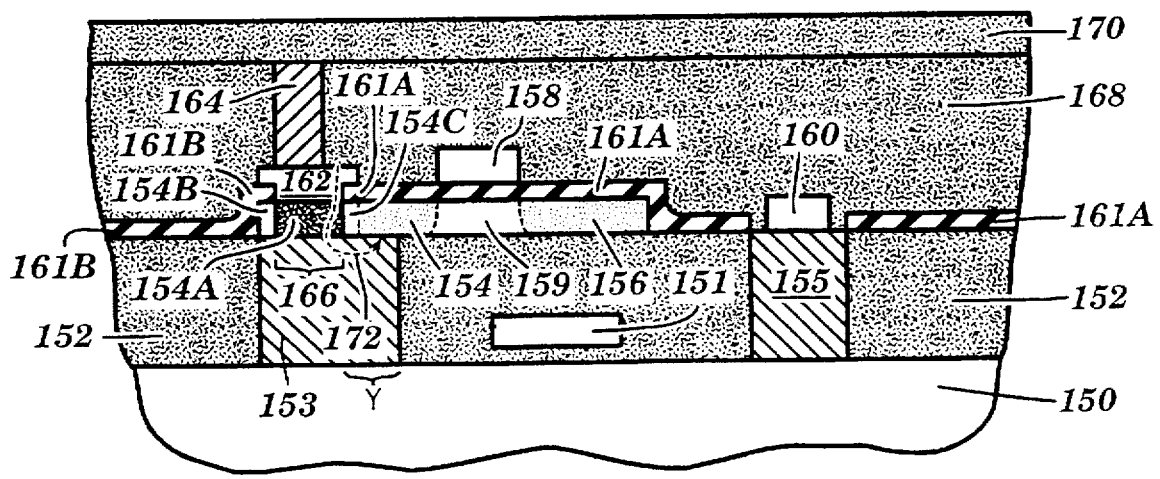
FIG. 5 is a cross-section of yet another FET structure based on an embodiment of this invention.

Yet another embodiment for alleviating or eliminating the problems associated with gouging is depicted in FIG. 5. Again, features in this figure are analogous to those in FIGS. 2–4. In this embodiment, contact via 166 has been purposefully reduced in size, so that layer 154A (which includes the buried contact implant) is not susceptible to gouging. The prevention of gouging is in part caused by the formation of contact layer 162, which now overlaps gate dielectric layer 161A/161B. Thus, the aggressive etching steps which are sometimes needed to provide the final shape for contact layer 162 will not affect layer 154A, which lies underneath the bulk of the contact layer.

Regions 154B and 154C do not receive any doping during the buried contact implant, nor do they receive any doping utilized to form diffusion region 154/156. Thus, region 154C, covered by a portion of layer 161A and contact layer 162, will not serve as an effective passageway for current. In order to ensure proper current flow for circuit performance, stud 153 has been expanded a dimension "Y", so that the current can flow under the bottom of undoped region ("layer") 154C, through the expanded width of the stud, and up to diffusion region 154. (The general path of current is indicated by the dash-line arrow in FIG. 5.) As in the embodiment of FIG. 4, the expansion of the stud is to an overlap width sufficient to bring it beyond the area which would normally rest under both gate dielectric layer 161A and contact layer 162. The necessary expansion will of course also depend on current requirements and material conductivities. In general, for a TFT suitable for an SRAM of the dimensions described above, the amount of overlap will be at least about 0.1 micron past the contact layer's sidewall edge closest to gate 158.

As in the embodiments previously set forth, the deposition of gate 158 and contact layer 162 may be accompanied by the simultaneous deposition of contact layer 160, which can be in direct contact with a portion of the upper terminus of stud 155. (As before, a protective interfacial layer may be used between the bottom surface of layer 160 and the top surface of the stud.)

In yet another embodiment discovered by the inventors to eliminate the gouging problem, contact via 166 need not be reduced in size (i.e., from the width of via 66 in FIG. 2). Instead, the overlap of contact layer 162 on gate dielectric layer 161A could be expanded in the direction of gate 158, while the underlying stud 153 is also expanded in width. In this embodiment (which does not have to be depicted in a figure), current will still be able to flow freely through contact layer 162, layer 154A, and the expanded portion of the stud, ending up in diffusion region 154. The stud expansion will again be to an extent that allows the current to flow around the bottom of layer 154C, i.e., usually at least about 0.1 micron past the contact layer's edge closest to the gate.

It should be apparent from the preceding description that another embodiment of the present invention is directed to an SRAM cell which comprises one or more of the FET structures set forth above. The SRAM cell would of course include most or all of the features depicted in FIG. 1, with the various connections and cross-coupled connections being determined by the design and function of the particular cell. As described previously, one advantage of using FET structures with the contact layer described above in an SRAM is the substantial reduction in space requirements. These reduced space requirements in turn can lead to much higher integration within a semiconductor device.

Also included within the scope of this invention is an improved method for constructing an FET structure, comprising the steps of:

(i) forming a stud on a substrate or insulator-covered substrate; and (ii) forming a TFT over the stud, wherein the diffusion region of the TFT is in contact with the upper terminus of the stud.

As described previously, a contact layer is formed on top of at least a portion of the diffusion region (often the portion to which the stud is connected). The contact layer is formed simultaneously with the formation of the transistor gate electrode of the TFT. The diffusion region on which the contact layer will be formed is first doped with a buried contact implant prior to deposition of the contact layer.

The method of this invention may further comprise the formation of a second stud (e.g., stud 55 in FIG. 2) substantially parallel to the stud formed in step (i), and spaced therefrom. A second contact layer (e.g., element 60 in FIG. 2) of the material forming the transistor gate electrode is then formed on the upper terminus of the second stud, simultaneously with the formation of the gate electrode.

It should be understood that the inventive features set forth in copending application Ser. No. 08/537,219 may be incorporated in one or more of the embodiments of the present invention. For example, an undoped cap oxide layer could be applied and patterned prior to formation of studs 53 and 55 in FIG. 2. This layer would eventually abut the upper region of each stud and would serve to prevent any phosphorous in the insulator layer material from diffusing into the polysilicon-type layer which would subsequently be applied to form layers 54A, 54, 59, and 56. As mentioned in the copending case, diffusion of phosphorous or a similar material could undesirably result in the counter-doping of ions which would be implanted in a subsequently-applied layer.

Moreover, the present invention could also include the "stacking" of TFT's. For example, a secondary stud like 64 in FIG. 2 could be attached at its upper terminus to a source or drain region of a secondary level thin film transistor (or to a metal interconnection layer). Furthermore, a tertiary level stud (not shown) could be attached at its lower terminus to the source or drain of the secondary level TFT, and attached at its upper terminus to either a metal interconnection layer, or to the source or drain region of a tertiary level TFT. Any of the TFT's at any of the vertical levels of a stacked array could include the contact layer described above, which in turn could be connected to another active feature in another transistor, for example. Moreover, more than one stud could be situated at each level, depending on the design of the particular circuit (e.g., in FIG. 2, there could be an additional stud parallel to stud 64, connecting contact layer 60 to another active site). One or more of the studs could be expanded in width as described previously to eliminate or alleviate the effects of gouging during formation of contact layers.

While this invention has been particularly shown and described with reference to preferred embodiments, it will be understood by those skilled in the art that various changes in form and detail may be made herein without departing from the spirit and scope of the invention. This is especially true in view of the usual tendency for semiconductor structures to eventually become reduced in size and increased in density of features. It is expected that all of the embodiments set forth above would be applicable to such devices.

All of the above-referenced patents are incorporated herein by reference.

We claim:

1. A field effect transistor structure, comprising:

a thin film transistor comprising a diffusion region and a channel;

a gate dielectric layer disposed over the channel and over a first portion of the diffusion region; and a transistor gate electrode disposed over a portion of the gate dielectric layer, above and substantially self-aligned with the channel; and a contact layer of transistor gate electrode-material disposed above and adjacent at least some of a second portion of the diffusion region; wherein the contact layer is formed simultaneously with the transistor gate electrode and connects said second portion with a gate of another transistor.

2. The structure of claim 1, wherein said contact layer is in direct contact with at least some of the second portion of the diffusion region, and said another transistor comprises a thin film transistor.

3. The structure of claim 2, wherein said second portion is adjacent said first portion and comprises a buried contact.

4. A field effect transistor structure comprising:

a thin film transistor comprising a diffusion region and a channel;

a gate dielectric layer disposed over the channel and over a first portion of the diffusion region;

a transistor gate electrode disposed over a portion of the gate dielectric layer, above and substantially self-aligned with the channel; and a contact layer of transistor gate electrode-material in direct contact with at least some of a second portion of the diffusion region and connecting said second portion of the diffusion region with a gate of another transistor.

5. The structure of claim 4 wherein said second portion is adjacent said first portion, and the contact layer is formed simultaneously with the transistor gate electrode.

6. The structure of claim 4 wherein said another transistor comprises a thin film transistor.

* * * * *